United States Patent [19]
Kwon

[11] Patent Number: 5,430,250
[45] Date of Patent: * Jul. 4, 1995

[54] WIRE SUPPORT AND GUIDE

[75] Inventor: Young I. Kwon, San Jose, Calif.

[73] Assignee: VLSI Technology, Inc., San Jose, Calif.

[ * ] Notice: The portion of the term of this patent subsequent to Dec. 27, 2011 has been disclaimed.

[21] Appl. No.: 224,808

[22] Filed: Apr. 8, 1994

Related U.S. Application Data

[63] Continuation of Ser. No. 811,551, Dec. 20, 1991, Pat. No. 5,376,756.

[51] Int. Cl.⁶ .............................................. H01L 23/02
[52] U.S. Cl. .................................. 174/52.4; 257/676; 257/684; 257/704; 257/787; 361/728; 361/730; 174/52.2
[58] Field of Search ............................... 257/666–667, 257/676, 678, 684, 690, 787, 692–694, 704; 174/52.2, 52.4; 361/730, 760–761, 728, 767, 772, 813

[56] References Cited

FOREIGN PATENT DOCUMENTS

| 0078606 | 5/1983 | European Pat. Off. . |
| 0007953 | 1/1982 | Japan . |
| 0023254 | 2/1982 | Japan . |
| 9107553 | 6/1984 | Japan . |
| 0159549 | 9/1984 | Japan . |
| 1240664 | 10/1986 | Japan ................................. 257/790 |

*Primary Examiner*—Bot Ledynh
*Attorney, Agent, or Firm*—Patrick T. King

[57] ABSTRACT

Single, continuous bonding wires for an integrated-circuit die are supported in mid-span by a support ring which is snap-fit or adhesively bonded to a die-attach paddle of a leadframe. The support member includes a groove formed in its distal end for receiving an adhesive material, if necessary, for securing the bonding wires in position to prevent wire-wash and electrically shorting of the bonding wires when a plastic molding compound is formed around the die and leadframe. Alternatively the bonding wires are contained within notches formed in the distal end of the support ring. A lid placed over the support ring provides an enclosure for the integrated-circuit die. Stacking of support rings on each other and concentric support rings provide various optional arrangements for supporting bonding wires.

2 Claims, 3 Drawing Sheets

WIRE SUPPORT AND GUIDE

This is a Continuation of application Ser. No. 07/811,551, filed Dec. 20, 1991, now U.S. Pat. No. 5,376,756.

BACKGROUND OF THE INVENTION

1. Field of the Invention

This invention relates generally to integrated circuits and more particularly to integrated circuit packaging assemblies.

2. Prior Art

Wire bonding is the technique generally used for electrically connecting an integrated-circuit die to the leads of a leadframe. Each bonding wire connects a bonding pad on the integrated-circuit die to a bonding finger on the leadframe. The lengths of bonding wires have been increasing due to several technological developments: smaller die sizes, larger die-attach paddle areas, and the requirement for minimum lead spacing while an increased number of leads are required. Use of a smaller die width the same size leadframe requires a longer bonding wire. The increased number of bonding pads and the requirement for minimum lead spacing causes the bonding fingers of the leadframe to be farther away from a die positioned to the center of the die-attach paddle of a leadframe.

In general, a bonding wire having a length greater than 150 mils has reliability problems in many package types. A gold thermosonic-bonded bonding wire with a length of 175 mils has excess wire sag which may causes shorting between wires. Moreover, during the plastic molding process, which encapsulates the integrated-circuit die and its related elements with a plastic molding compound, so called wire wash effects occur due to the washing, or sweeping action of the molding compound. This results in physical breakage of the bonding wires and also causes electrical shorts to occur between the long, thin bonding wires with lengths greater than 100 mils.

Various types of coatings have been used to avoid the shorting and wirewash problems associated with using long, thin bonding wires. However, use of these coatings require either extensive process modifications or they have questionable reliability. One bonding technique which avoids the use of long bonding wires is the tape-automated bonding (TAB) technique, such as described in U.S. Pat. Nos. 3,689,991 and 3,544,857, which disclose use of a metallized polyimide TAB tape to bridge the gap between a bonding pad on a die and the bonding finger. The additional financial cost and the process modifications required for use of the TAB technique have kept conventional bonding-wire techniques commercially viable.

Consequently, a need exists for an economical, easily implemented technique for bridging gaps greater than 175 mils between the bonding pads of an integrated-circuit and the associated bonding fingers of a leadframe.

SUMMARY OF THE INVENTION

Therefore, an object of this invention is to provide a simple, economical integrated-circuit bonding-wire support assembly, which supports and secures bonding wires having lengths greater than 175 mils to minimize the wire-wash as well as wire-shorting problems.

In accordance with this and other objects of the invention, the present invention provides a non-conductive bonding-wire support assembly. An integrated-circuit die is mounted to a die-attach paddle. To prevent wirewash and wire-shorting, a wire-support member is provided which has the form of a multi-sided ring mounted on the edges of a die-attach-paddle of a leadframe by various means, including a snap-fit arrangement and adhesives. The body member serves as a bridge to support the span of a long bonding wire between a bonding pad on an integrated-circuit die and a corresponding lead finger of the leadframe. Bonding wires are tensioned to lie across the distal end of the support body member. The support member guides and fixes a bonding wire in place to reduce the likelihood of physical breakage and electrical short circuits during the plastic molding process.

The invention provides for supporting single, continuous bonding wires for an integrated-circuit die in mid-span. A support ring having, for example, a polygonal shape, is snap-fit or adhesively bonded to a die-attach paddle of a leadframe. The support member or ring includes a groove formed in its distal end for receiving an adhesive material, if necessary, for securing the bonding wires in position to prevent wire-wash and electrically shorting of the bonding wires when a plastic molding compound is formed around the die and leadframe. Alternatively, the bonding wires are contained within notches formed in the distal end of the support ring. A lid placed over the support ring provides an enclosure or cavity for the integrated-circuit die within the molded package body. Stacking of support rings on each other and concentric support rings provide various optional arrangements for supporting bonding wires.

An advantage of this technique according to the invention is that the bonding wire movement is limited to minimize wire-wash effects. Another advantage of the present invention is that different die sizes can be used with the same leadframe by simply snapping or fixing a support member onto a die-attach paddle. This saves money and time as well as minimizing process changes.

These and other objects and advantages of the present invention will become clear after a reading of the following detailed description as accompanied by the several figures of the drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
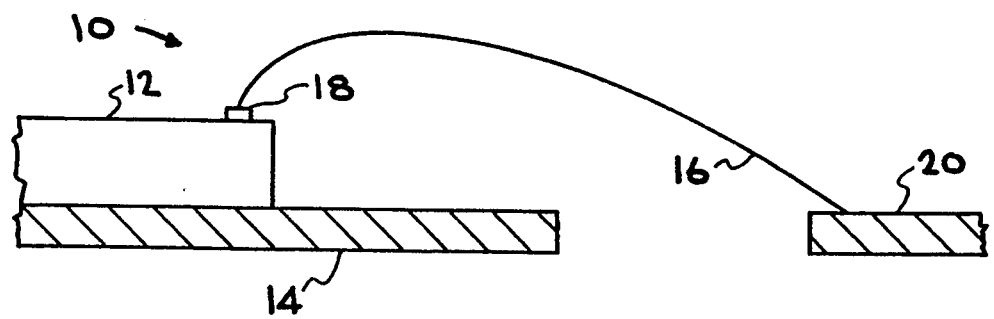
FIG. 1 is a partial, cross-sectional view of a prior art molded-plastic package arrangement having a standard bonding-wire configuration for long bonding-wires, which is subject to wire-wash effects, especially when the length of a bonding-wire exceeds 150 mils.

FIG. 1 shows a portion of a prior art molded-plastic package arrangement 10, which uses a conventional gold-wire wire-bonding arrangement. An integrated circuit die 12 is fixed to a die-attach paddle 14 of a leadframe. A bonding wire 16 has one end bonded to a bonding pad 18 on the integrated-circuit die 12 and the other end bonded to a bonding finger 20 of the leadframe. This provides an electrical connection between the bonding pad 18 on the integrated-circuit die 12 and its corresponding bonding finger 20 on the leadframe. The bonding wire 16 is shown connected in a "non-tensioned" configuraton, that is, with a certain amount of slack in it. A bonding wire in this configuraton is subject to wire-wash effects, particularly when the bonding-wire length exceeds 150 mils. During the plastic molding process, a slack, or non-tensioned, wire tends to be swept away by the molding compound so that it may be broken or electrically shorted.

Figure 2:
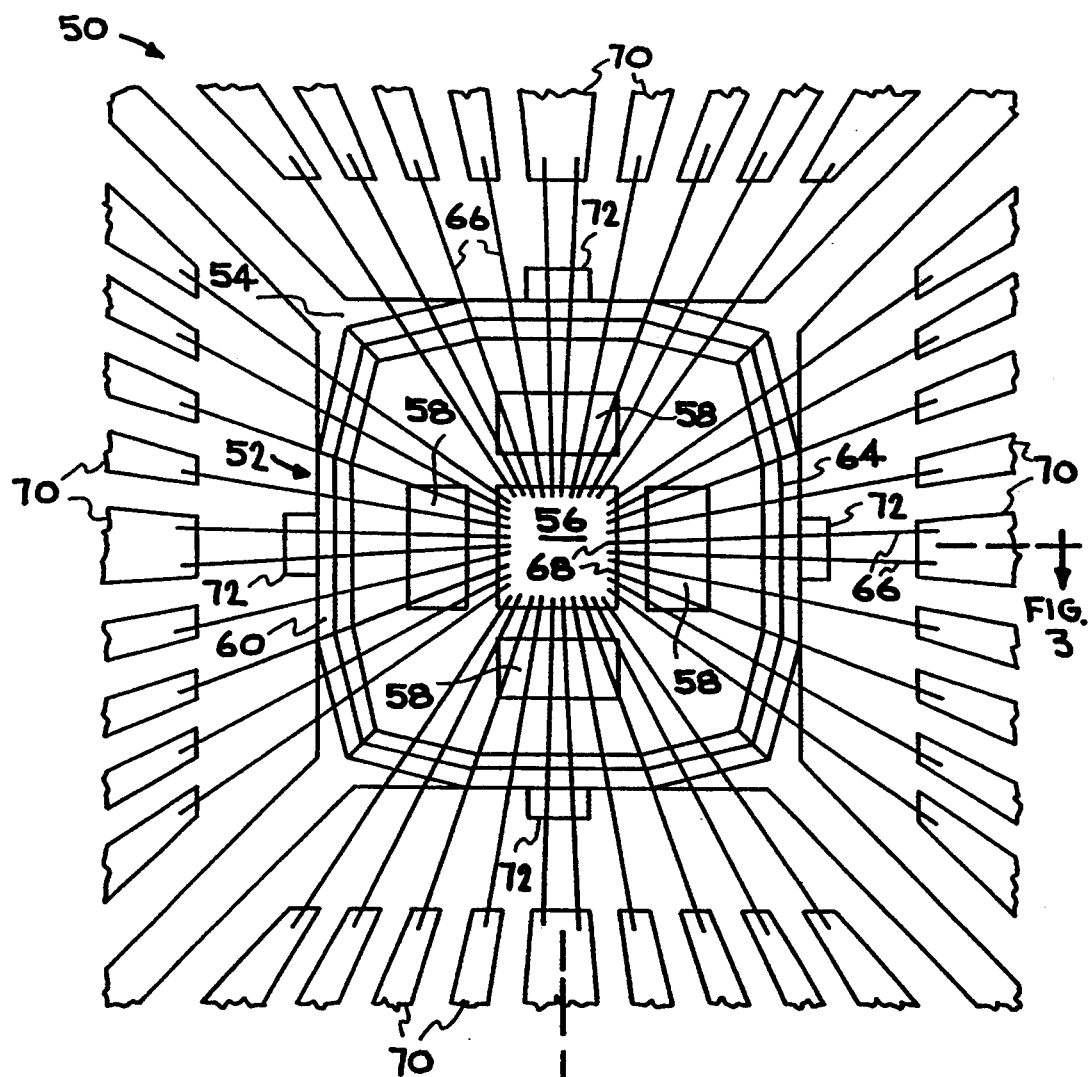
FIG. 2 is a plan view of a molded-plastic arrangement according to the invention, in which a multi-sided bonding-wire support ring is provided.

FIG. 2 shows a plan view of an assembly 50 for supporting bonding-wires in a molded-plastic package, according to the invention.

Figure 3:
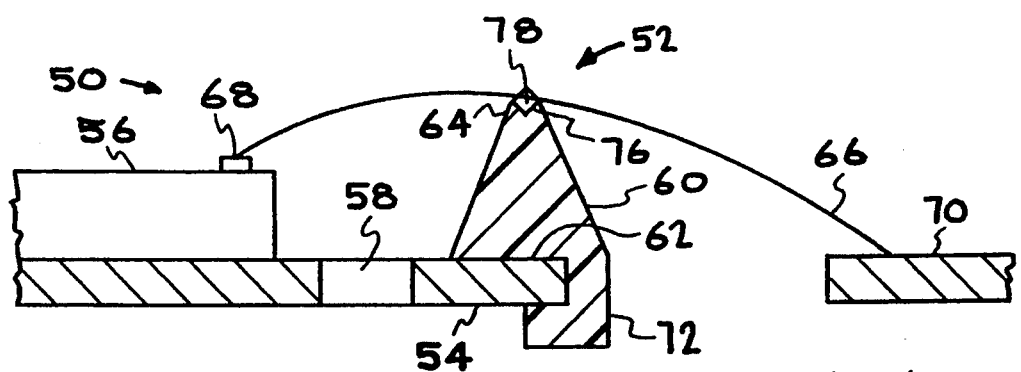
FIG. 3 is a partial cross sectional view of one embodiment of a molded-plastic package arrangement which provides a multi-sided ring bonding-wire support assembly in accordance with this invention.

FIG. 3 shows a partial, cross-sectional view of a portion of the assembly of FIG. 2.

Referring to FIGS. 2 and 3, a multi-sided bonding-wire support ring assembly 52 is provided in accordance with this invention. A die-attach paddle 54, which is part of a leadframe, has a die 56 attached to its top surface. The die-attach paddle 54 has molding relief holes 58 which allow plastic molding compound to freely flow around the die 56.

A non-conductive support member is formed, for example, as a polygonal ring 60 extending upwardly from the die-attach paddle. The base 62 of the support member 60 is fixed to the die-attach paddle 54, near the edges of the paddle, as shown in the Figures. The distal end 64 of the support member 60 support a number of bonding-wires (typically shown as 66) near the middle of their spans, where the bonding-wires extend from bonding pads (typically shown as 68) to corresponding bonding fingers (typically shown as 70). FIG. 3 shows that use of the support member 60 permits the wires to be tension-bonded, that is, bonded so that there is little slack in the wires. Note that the support member alternatively has a number of variations. For example, the support member can be segments of a ring, so that support for longer bonding wires is provided, for example, for bonding pads at the corners of an integrated-circuit die, where the associated bonding wires are longer than the bonding wires for bonding pads near the middle of the sides of an integrated-circuit. The ring can have a variety of shapes, such as the polygonal ring described in connection with FIGS. 2 and 3 or, for example, a circular ring.

The polygonal-ring support member, or ring, 60 of this embodiment of the invention has its base attached to the die-attach paddle 54 of the leadframe. Base clamp portions 72 of the ring 60 are formed in this embodiment of the invention as integral parts of the ring 60. The base clamp portions of the ring 60 extend around and lock onto the edges of the die-attach paddle 54 to provide snap-fit attachment of the ring to the die-attach paddle 54. In addition or alternatively, an adhesive material is disposed between the base 62 of the ring 60 and the upper surface of the die-attach paddle 54 to secure the ring 60 to the die-attach paddle 54. The side wall of the ring 60 can be sloped as shown so that the base 62 is wider than the distal end 64 to permit plastic molding compound to flow around the ring 60.

A groove 76 is formed along the end 64 of the ring 60. A bead 78 of non-conductive adhesive material, such as, for example, polyimide or epoxy material, is formed within the groove 76 for securing the bonding-wires (typically shown as 66) to the support member.

In practice, the body member 200 is made of non-conductive, high-temperature plastic materials. The adhesive materials are to polyimide or epoxy materials, which are cured, for example, by ultraviolet radiation or by temperature curing. The bonding wires are not as slack, that is, they are tensioned, and are supported by the ring 60. The overall span of the bonding wires can therefore be greater, for example, 200 mils while still providing reliable connections and avoiding the problems of wire-wash associated with bonding wires having lengths greater than 150 mils.

Figure 4:
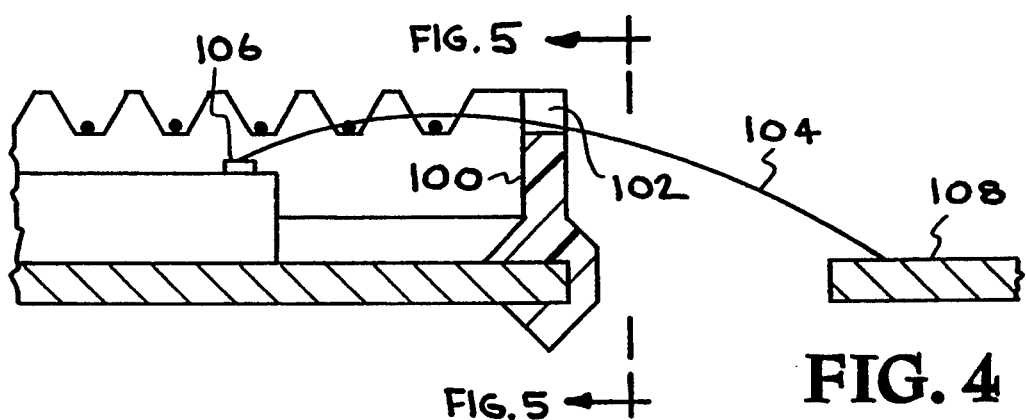
FIG. 4 is a partial cross sectional view of another embodiment of a multi-sided ring bonding-wire support assembly, wherein a plurality of serration, or notches, are formed on the distal end of a support member to secure bonding wires which traverse therethrough.
Figure 5:
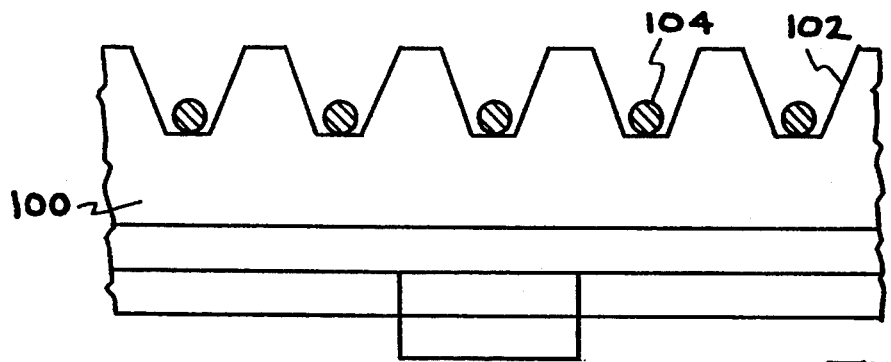
FIG. 5 is an enlarged, partial, cross-sectional view taken along the section line 4A—4A of FIG. 4.

FIGS. 4 and 5 show an alternative embodiment of a support ring 100. Formed along its top edge the support ring 100 has a number of notches (typically shown as 102) in which bonding wires 104 (typically shown) rest. The support ring is located such that the bonding wires are supported in the notches at approximately mid-span between a bonding pad 106 and a leadfinger 108 of a leadframe. The bonding wires are slightly tensioned so that they rest within a notch, which keeps the bonding wires in place during the molding process to eliminate the harmful effects of wire-wash.

Figure 6:
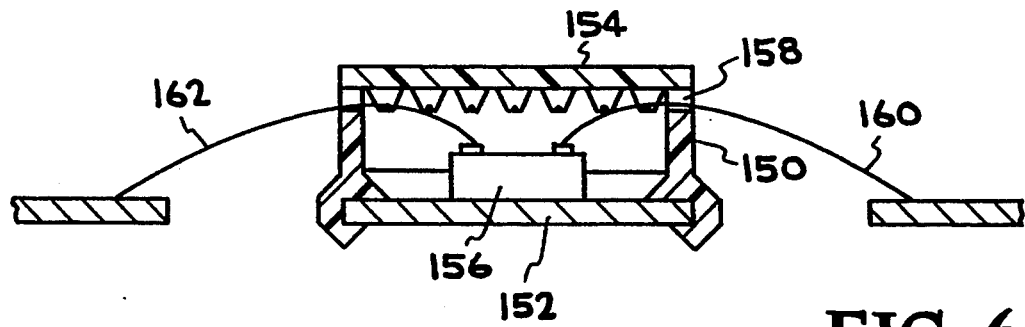
FIG. 6 is a cross sectional view of a further embodiment of the invention, which shows a non-conductive lid positioned on a multi-sided support and providing a chamber for enclosing an integrated-circuit die.

FIG. 6 shows a further embodiment of the invention in which a bonding-wire support ring 150 attached to a die-attach paddle 152 of a leadframe. This support ring 150 is similar to the ring 60 shown in FIG. 2 with the exception of not having a molding relief hole in the die-attach paddle. This embodiment of the invention provides a nonconductive lid 154, the lower surface of which rests along the distal end of the support ring 150. The support ring and the lid 154 provide an enclosure for an integrated-circuit die 156 attached to the die-attach paddle 152. An adhesive bead 158 is formed in a groove along the top surface of the support ring member 150. The adhesive bead 158 forms a seal for the enclosure and fixes bonding wires (typically shown as 160, 162 in position to prevent wire-wash effects. The lid 154 is made of the same material as the support ring 150. The enclosure prevents plastic molding-compound from contacting the integrated-circuit die 156 and prevents thermal stress on the die due to different thermal coefficients of expansion between the materials of the die and the plastic molding-compound material.

Figure 7:
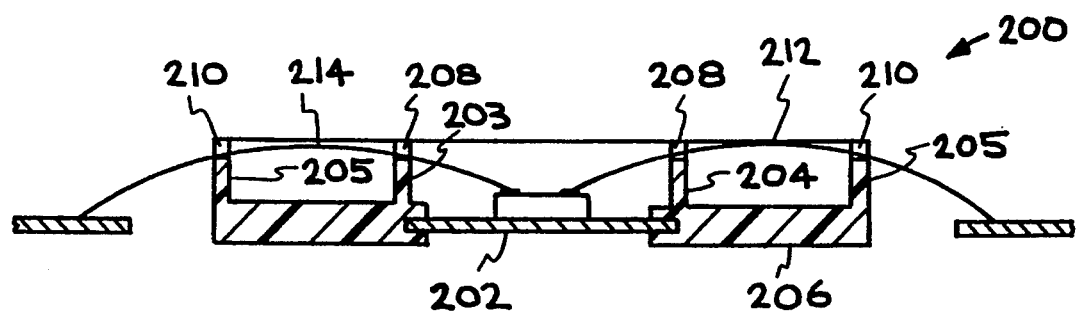
FIG. 7 is a cross sectional view of a support structure having two support members in accordance with this invention.

FIG. 7 shows an alternative embodiment of the invention in which a multi-ring, bonding-wire support assembly 200 is snap-fit or adhesively attached to a die-attach paddle 202, in a manner similar to that of FIGS. 2 and 3 hereinabove. This support assembly 200 includes two concentric rings 202,203 and 204,205 each extending upwardly from a base portion, which is fixed to the edges of the die-attach paddle 202, as indicated in the Figure. The distal ends of each of the rings have grooves formed therein for containing, if necessary, a bead of adhesive material 208, 210. Bonding wires (typically shown as 212, 214) are supported at two points along their spans by the distal ends of the support rings 202,204. This enables bonding wires much longer than 150 mils to be used. This is particularly useful in applications where a very small die is being used with a large, standard leadframe, where standard wire-bonding connections would use bonding-wires much longer than 150 mils and be subject to damage by wire-wash, when a plastic molding-compound is molded over the die and leadframe.

Figure 8:
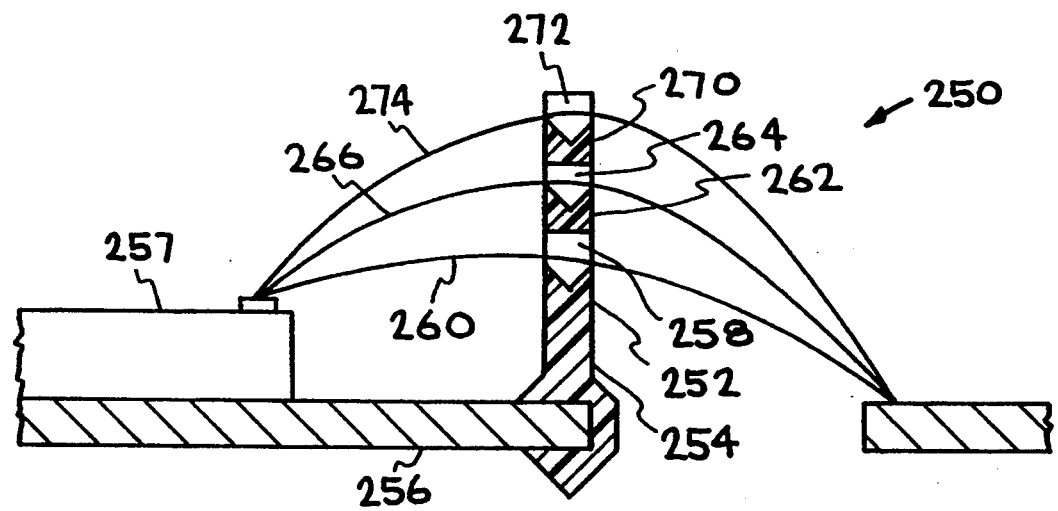
FIG. 8 is a partial, cross-sectional view showing a support member having three levels of supports stacked together in accordance with this invention.

FIG. 8 shows another embodiment of the invention which provides a bonding-wire support assembly 250, which utilizes multiple, stacked support rings. A polygonal ring 252 similar to that described in connection with FIGS. 2 and 3 hereinabove has its base 254 fixed to a die-attach paddle 256 for an integrated-circuit die 257. A groove is formed in the distal end of the ring 252 for receiving a bead 258 of adhesive material, which fixes in position the mid-span of a bonding wire 260. An intermediate support ring 262 has its base bonded to the adhesive bead 258. A groove formed in the distal end of the intermediate ring 262 contains another bead 264 of adhesive material, which also fixes in position the mid-span of another bonding wire 266. A third support ring 270 has its base bonded to the adhesive bead 264. A groove is formed in the distal end of the third ring 262 to contain another bead 272 of adhesive material, which also fixes in position the mid-span of another bonding wire 274. This multi-level support assembly 250 provides support for bonding wires which alternate support points between the various levels provided by the three rings. For a two level configuration, alternate bonding wires go to each level. For a three-level configuration, every third wire is bonded to a particular level.

Figure 9:
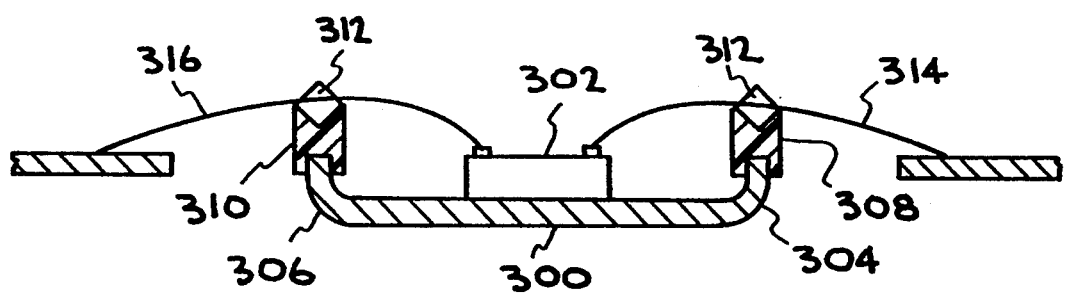
FIG. 9 is a cross sectional view of a die-attach paddle having its edges bent upwardly to provide a base for a bonding-wire support structure in accordance with the invention.

FIG. 9 shows another embodiment of the invention. In this embodiment, a metal die-attach paddle 300 portion of a leadframe (such as typically shown in FIG. 2) has an integrated-circuit die 302 attached to its upper surface. The edges 304, 306 of the die-attach paddle 300 are formed to extend substantially perpendicularly upward. Attached along the ends of the edges are support members 308, 310 which contain a bead 312 of adhesive material for fixing the mid-spans of bonding wires 314, 316 in position. This particular embodiment of the invention provides support for the bonding wires while minimizing the stress exerted on the support ring system.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An assembly for supporting bonding wires in a molded-plastic package for an integrated-circuit comprising:

an integrated circuit die centrally attached to a die-attach paddle portion of a leadframe, said leadframe having a plurality of inwardly-extending bonding fingers peripherally surrounding said die-attach paddle portion of said leadframe, a support member having a proximate base end fixed to said die-attach paddle and a distal end for supporting each of a plurality of single, continuous bonding wires extending from said integrated-circuit die to said inwardly-extending bonding fingers of said leadframe, said support member having sloped side walls extending between said distal and proximate ends, said proximate base end of said support member being wider than said distal end; and attachment means for attaching said support member to said die-attach paddle portion of said leadframe.

2. An assembly for supporting bonding wires in a molded-plastic package for an integrated-circuit comprising:

an integrated circuit die centrally attached to a die-attach paddle portion of a leadframe, said leadframe having a plurality of inwardly-extending bonding fingers peripherally surrounding said die-attach paddle portion of said leadframe, said die-attach paddle having at least one relief hole formed therethrough to allow for the passage of molding compound through said die-attach paddle, support means for supporting each of a plurality of single, continuous bonding wires extending from said integrated-circuit die to said inwardly-extending bonding fingers of said leadframe; and attachment means for attaching said support means to said die-attach paddle portion of said leadframe.

* * * * *